United States Patent [19]

Herman et al.

[11] Patent Number: 4,698,585

[45] Date of Patent: Oct. 6, 1987

[54] APPARATUS FOR IDENTIFYING THE CONNECTION POSITION OF A WIRE HAVING TWO MODES OF OPERATION

[75] Inventors: John Herman, Bethel; George Chirico, Huntington, both of Conn.

[73] Assignee: The Perkin-Elmer Corporation, Norwalk, Conn.

[21] Appl. No.: 187,013

[22] Filed: Sep. 15, 1980

[51] Int. Cl.$^4$ ............................................. G01R 19/00
[52] U.S. Cl. ................................................... 324/66
[58] Field of Search .................... 324/66; 350/96.1; 179/175.3; 29/755

[56] References Cited

U.S. PATENT DOCUMENTS

| | | | |
|---|---|---|---|
| 2,953,744 | 9/1960 | Miller et al. | 324/66 |
| 3,532,873 | 10/1970 | Batson et al. | 350/96.1 |
| 3,706,134 | 12/1972 | Sweeney et al. | 29/755 |
| 4,030,029 | 6/1977 | Cox | 324/66 |

FOREIGN PATENT DOCUMENTS 2634144  4/1978  Fed. Rep. of Germany ........ 324/52

Primary Examiner—Reinhard J. Eisenzopf
Assistant Examiner—W. Snow
Attorney, Agent, or Firm—Edwin T. Grimes; Francis L. Masselle; Thomas P. Murphy

[57] ABSTRACT

A fixture is provided for holding a cable end connector to which wires are to be attached. The fixture includes an indicating element for each of the connection elements of the connector to be wired. A separate fiber-optic cable extends from each indicating element to a separate light source for individually providing illumination to the separate indicating elements. A means is provided for making an electrical connection to individual electrical elements to separately identify each of the different wires to be assembled, and an electrical driving means is connected to respond to the electrical connection means for energizing the corresponding one of the light sources corresponding to the connection element to which the associated wire is to be assembled.

1 Claim, 10 Drawing Figures

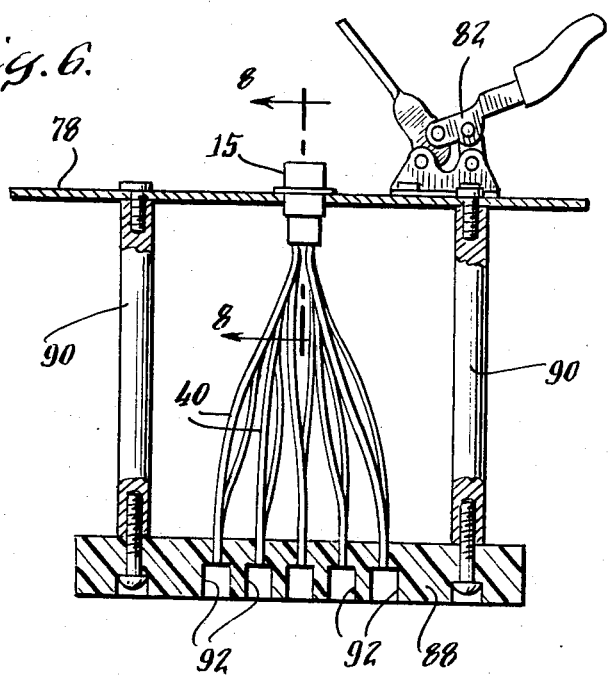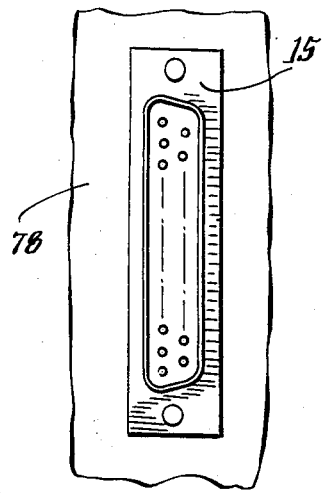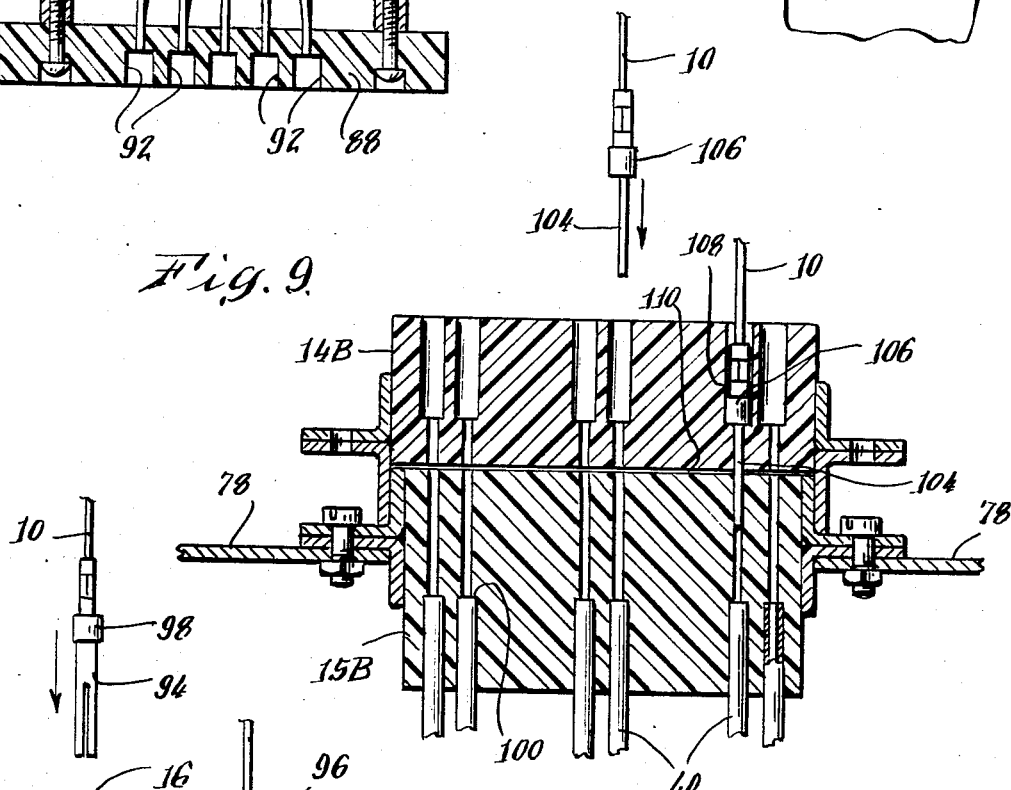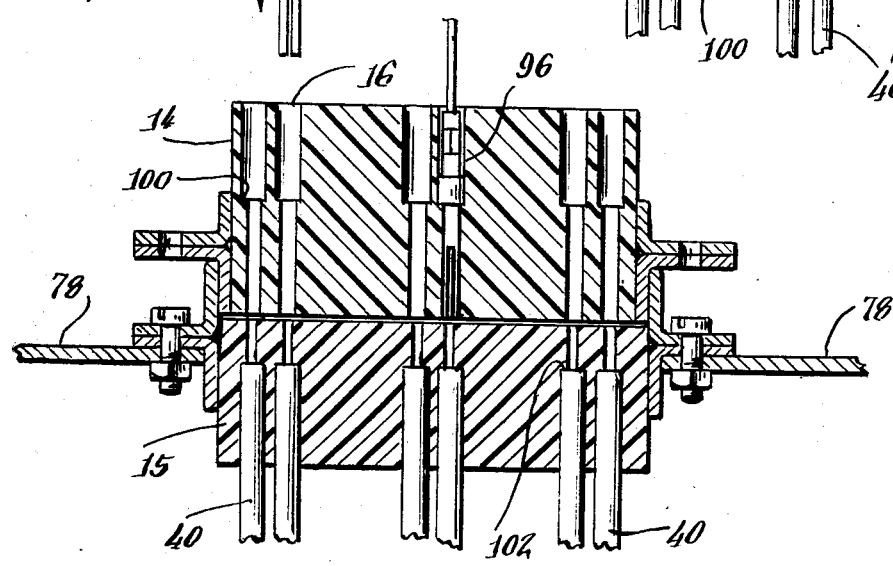

APPARATUS FOR IDENTIFYING THE CONNECTION POSITION OF A WIRE HAVING TWO MODES OF OPERATION

BACKGROUND OF THE INVENTION

The present invention relates to a wire position indicator which is especially useful in attaching wires to the mating parts of electrical cable end connector devices.

Separate components and units of electrical and electronic apparatus are commonly interconnected with one another through multiple conductor cables connected to the components and units by multiple contact cable end connectors which typically have mating pins and sockets. By this means, the components and units may be rapidly interconnected for use, or disconnected for shipping or storage. Connectors of this type commonly have multiple pin or socket connections. This means that there is a substantial possibility of error in attaching the respective conductor wires of the cables to the correct terminating positions. It is generally absolutely imperative that the connections of the wires be absolutely accurate.

Accordingly, it is one important object of the present invention to provide an improved means for indicating the position in one of the mating parts of a cable end connector to which a particular wire is to be assembled to that part with absolute accuracy.

Another problem in the wiring of multiple conductor cable end connector parts is that, normally, achieving great accuracy means continuously checking and rechecking where each wire is to be assembled so as to make certain that it is assembled to the correct terminating position. Such checking and rechecking necessarily takes time, and slows production speed.

Accordingly, it is another important object of the present invention to provide an improved apparatus for quickly and easily indicating the position to which a wire is to be assembled to one of the mating parts of a cable end connector with absolute accuracy to improve the speed of production.

In order to identify individual wires in a group of wires in a cable interconnecting electronic components through cable end connectors, it is common to employ color codes on the outside coverings of the wires. This practice has been so widespread that color coded wires are easily available and are very useful for this purpose. The color coded wires are useful not only during the original assembly of the connector cables, but also later during trouble shooting. However, there are many instances where color coding is required only for initial assembly, and is not required for trouble shooting because the entire cable, together with its connectors, can be replaced in case of trouble. Since the color coded wire is more expensive than wire that is not color coded, and requires a larger inventory of wire, and special sorting and handling, it is desirable to eliminate the color coding, if possible, where the only purpose in the color coding is to provide accuracy in the original assembly of the cable and connectors.

Accordingly, it is a further object of the invention to provide an improved apparatus for quickly and easily indicating the position to which a wire is to be assembled to one of the mating parts of a cable end connector within a multiple conductor cable without requiring the use of color coded wires, and thus eliminating the need for color coded wires.

Further objects and advantages of the invention will be apparent from the following description and the accompanying drawings.

SUMMARY OF THE INVENTION

In carrying out the invention, there is provided apparatus for quickly correlating the identification of one of a plurality of individual wires with the position to which that wire is to be connected into one of the mating parts of a multiple position cable end connector comprising a fixture for holding the one of the mating parts of the cable end connector which is to be wired, said fixture including a number of indicating elements corresponding to the number of connection elements of the connector part to be wired, each of said indicating elements being positioned to identify a particular connection element, a plurality of light sources corresponding in number to at least the number of said indicating elements, a separate fiber-optic cable extending from each light source to a corresponding one of said indicating elements, a plurality of electrical elements each respectively identifying a particular wire to be assembled into a particular connection element of the connector part, means for making an electrical connection to said electrical elements one element at a time to identify a wire to be assembled, electrical driving means connected to respond to said electrical connection means for energizing the one of said light sources corresponding to the connection element to which said wire is to be assembled, said light source being operable to transmit light through the associated fiber-optic cable to illuminate the one of said indicator elements corresponding to the connection element to which said wire is to be assembled.

BRIEF DESCRIPTION OF THE DRAWINGS

FIG. 6 is an enlarged sectional view illustrating a fixture for holding one of the mating parts of the cable end connector which is to be wired in the preferred physical structure of FIG. 4.

FIG. 7 is an enlarged top partial detail view of one embodiment of the fixture of FIG. 6.

FIG. 8 is an enlarged sectional side view illustrating details of the fixture of FIG. 7 and illustrating the interrelationship between the fixture and the mating part of the cable end connector which is to be wired where the female connector part (receptacle assembly) is to be wired.

FIG. 9 is a sectional side view corresponding to FIG. 8 but showing the arrangement for the assembly of a male connector (plug assembly).

DESCRIPTION OF PREFERRED EMBODIMENTS

Figure 1:
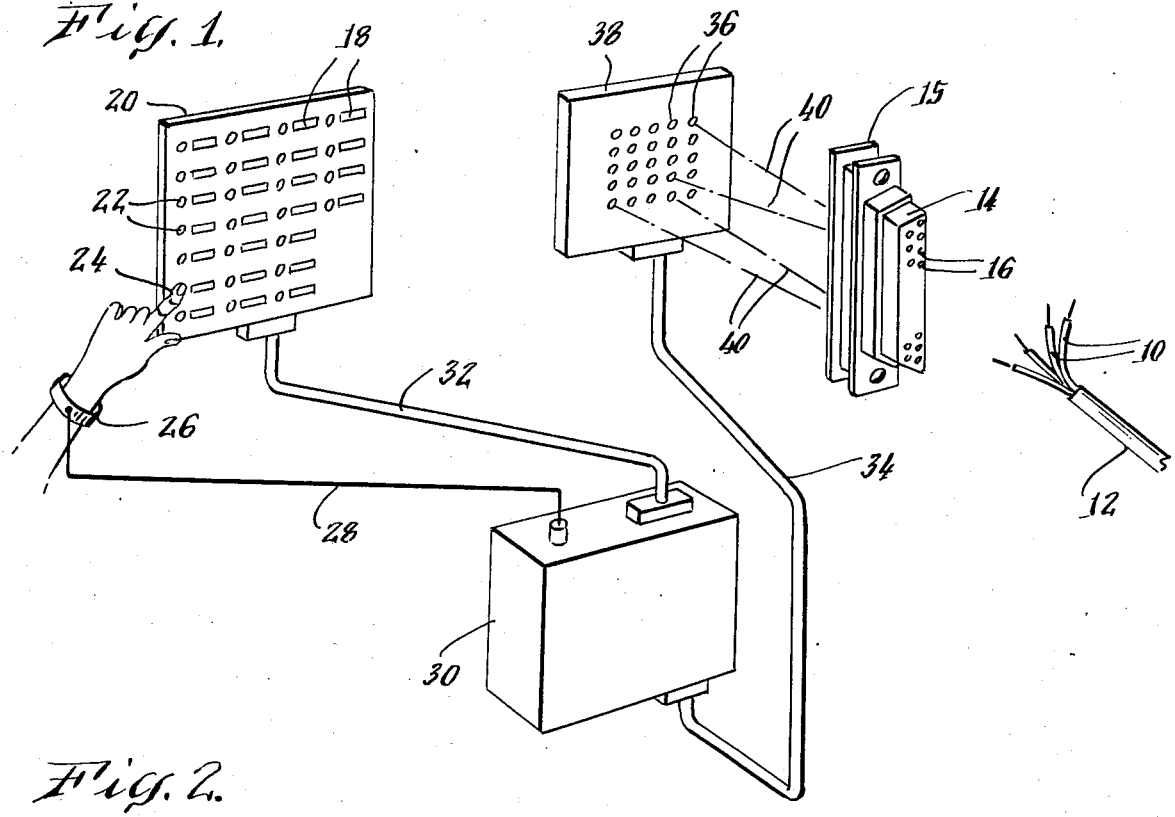
FIG. 1 is a schematic representation of a first embodiment of the invention.

Referring particularly to FIG. 1, the individual wire ends of a cable 12 are to be connected to the individual connection elements of a mating part 14 of a cable end connector which is supported upon a fixture 15. The connection elements of 14 may simply consist of through holes 16 of suitable size to receive the wire ends 10, and the wire ends 10 may be prefitted with pins (for male connectors) or sockets to receive pins (for female connectors). The insulation of the wire ends 10 is color coded. When the operator wishes to connect a particular wire 10, he looks at the color code of the insulation, and looks for the corresponding color code on one of the color code identification plates 18 of an electrical element panel 20. The operator then touches an electrical element, which preferably consists of an electrically conductive button located directly to the left of the selected plate 18. This operation is illustrated in the drawing by a representation of the operator's finger 24. The operator wears a conductive bracelet 26 which is connected by means of a conductor 28 to a circuit box 30. The electrical element panel 20 is also connected through a multiple conductor cable 32 to the electrical circuit box 30. The connection between the electrical element 22 on the panel 20 and the operator's finger at 24 completes a circuit within the circuit box 30 which operates through a multiple conductor connecting cable 34 to illuminate a selected one of the lamps 36 of a lamp panel 38. The circuits within box 30 are sometimes referred to below as an electrical driving means. The individual lamps 36, referred to hereinafter as light sources, are all optically connected by means of individual fiber-optic cables schematically indicated at 40 to the individual through hole connection elements 16 of the connector 14 by way of corresponding holes in fixture 15. Accordingly, the illumination of a particular lamp 36 causes the illumination of a particular through hole 16, thus indicating to the operator which hole the selected wire 10 is to be assembled to. Only a few of the fiber-optic cables are illustrated in FIG. 1. The through holes in fixture 15 through which the light is transmitted are sometimes referred to below as indicating elements.

Figure 2:
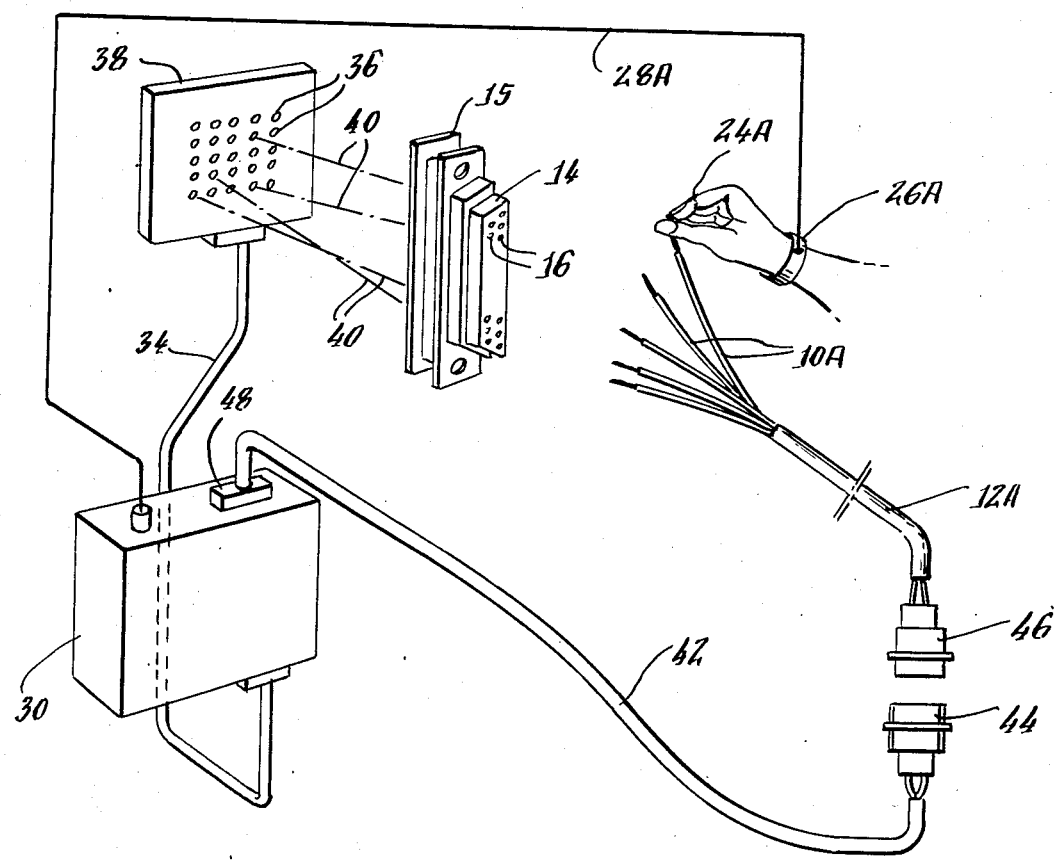
FIG. 2 is a schematic representation of a second embodiment of the invention, but which may actually be with the embodiment of FIG. 1.

FIG. 2 illustrates an alternative embodiment of the invention for connecting the individual wire ends 10A of a cable 12A, the other end of which has already been permanently wired to a cable end connector part 46. The cable 12A is connected by means of the connector part 46 and the mating connector part 44 through an intermediate interconnector cable 42 and a connector 48 to the circuit box 30. With this arrangement, no reference to the color coding of the individual wires 10A is necessary. The electrical connection for illuminating the proper lamp 36 to light up the appropriate connection element 16 is established by the operator simply by touching the wire which is to be connected, as illustrated in the drawing. This completes a circuit to the circuit box 30 through the connection 28A and the bracelet 26A and the fingers 24A of the operator through the selected wire 10A and through the cable 12A and the connectors 46 and 44 and the cable 42 and a connector 48. Thus, the operator need merely touch the wire which is to be connected and the corresponding connection element hole 16 is immediately lighted up so that he knows exactly which hole to insert the wire into. Thus the ends of the individual wires 10A themselves constitute the electrical elements identifying the wires.

It is one of the important features of the invention that, when operated in the mode illustrated in FIG. 2, color coding of the individual conductors 10A may be completely eliminated, if desired. Thus, the connector part 46 in FIG. 2 may be wired up using a cable 12A which contains conductors 10A which are not color coded, the wiring of the mating part 46 being carried out without the need for selecting any particular connection position for any particular wire, all of the connection positions simply being filled with wires at random. Then, when the connector 46 is attached to the connector 44 and the procedure is followed as described above in connection with FIG. 2, the correct positions for each of the wires 10A is electrically determined by the connections back to the circuit box 30, and the wires are thus attached to the proper positions 16 in the connector part 14 in order to provide the desired interconnections between the connector part 46 and the connector part 14.

While the above descriptions refer to a cable 12 in FIG. 1 and a cable 12A in FIG. 2, it will be apparent that the wires 10 or 10A need not be formed into a cable prior to the attachments of the individual wires to the connector parts, and the binding together of the individual insulated wires 10 or 10A into a multiple conductor cable, if desired, can be accomplished after the ends of the wires are connected.

While presented as separate embodiments in FIGS. 1 and 2, the structures of FIGS. 1 and 2 are preferably combined in a single structure. It is only necessary to have parallel connections from the circuit box 30 to the connection element panel 20 of FIG. 1 and to the cable 42 for the establishment of connections to the wired cable 12A in order to provide a combined structure.

Figure 3:
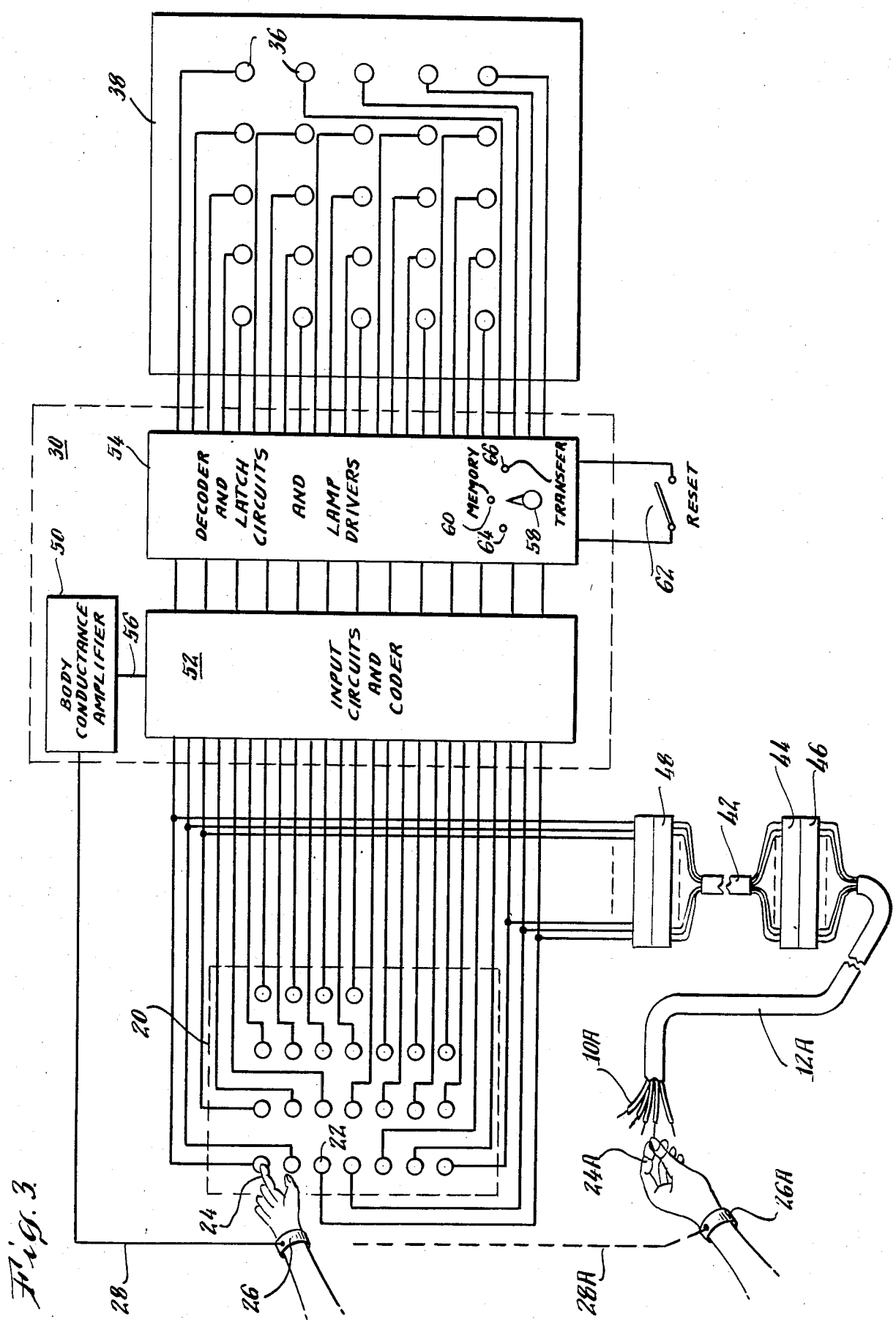
FIG. 3 is a schematic circuit diagram of a combination of the embodiments of FIGS. 1 and 2.

FIG. 3 is a schematic circuit diagram for a combination of the embodiments of FIGS. 1 and 2. As illustrated in FIG. 3, the contents of the circuit box 30 of FIG. 1 or FIG. 2 includes a body conductance amplifier 50, input circuits and coder 52, and decoder and latch circuits lamp drivers 54. If the operator's hand or finger is to serve as an electrical probe, essentially a part of an electrical connection means for establishing a circuit to energize a particular light source 36, then a sensitive body conductance amplifier 50 must be provided. Amplifier 50 is so sensitive to the change in conductance between the bracelet 26 and one of the buttons 22, or one of the wire ends 10A, caused by the presence of a human hand in that circuit that the completion of the circuit is reliably signalled at the output of the body conductance amplifier at 56 to the input circuits 52 without causing any discomfort to the operator. However, it is also possible to make use of a conductive probe to make the electrical contact between the lead 28 or 28A and the appropriate button 22 or wire 10A. This is sometimes referred to below as a common probe. Actually the bracelet 26 and the operator's hand and finger also form a common probe. The body conductance amplifier 52 is then not needed. It is also possible to provide conventional switches on the panel 20 instead of the conductive buttons 22. These switches can be simple momentary contact pushbutton switches. When that arrangement is employed for the panel 20, the body conductance amplifier 50 need not be used and the bracelet 26 need not be worn by the operator when operating the panel 20.

In one practical embodiment of the invention, it has been found to be quite advantageous to provide as many as twenty-five input circuits and twenty-five different light sources 36, as shown. If desired, the input circuits 52 and the latch circuits and lamp drivers 54 may simply provide twenty-five completely separate amplifier, latching and lamp driver channels. However, it has been found that some economies may be realized by coding the input signals so that each input signal energizes two or more coded switching elements, with each input signal energizing a unique combination of such input signal elements. By this means, fewer amplifiers may be made to uniquely serve all twenty-five channels. The coding is accomplished within the circuit 52 by conventional means such as diode coding networks. The subsequent decoding is accomplished within circuit 54 to provide unique outputs to each of the twenty-five lamps 36 through appropriate lamp drivers. The decoding is carried out by conventional logic circuits containing logic components such as AND gates which detect the presence of each of the twenty-five unique switching element combinations.

Preferably, the circuit 54 provides several different modes of operation which may be selected by a selector switch schematically indicated at 58. If the selector switch 58 is set at 60 for "memory", whenever a circuit is completed to one of the buttons 22 of panel 20, or to one of the wires 10A, that circuit is "latched in" and the corresponding lamp 36 stays on even after the input signal is removed. This permits manipulation of the wire as it is being assembled without the necessity for continuously maintaining the input signal connection. However, after the wire has been assembled, the latch circuit providing the memory function may be reset by means of a switch 62 illustrated below circuits 54, which preferably consists of a foot switch easily and conveniently actuated by the operator. If the selector switch 58 is moved to the position indicated at 64, there is no memory function at all, and the lamp 36 corresponding to a particular button 22 on panel 20 or to a particular wire 10A, remains on only while the input signal circuit is completed. On the other hand, if the switch 58 is moved to the third position 66, each latch circuit operates to pick up and remember the last connection which was made to keep the associated lamp on until a new connection is made, at which time, the latch for the prior circuit is reset. Thus, by making successive connections at the buttons 22 or at the wires 10A, a succession of the lamps 36 is lit, one at a time, indicating where the respective wires are to be assembled.

It is very important in the operation of the apparatus that the correct connection element into which wire connectors are to be inserted must be lighted up in response to the selection of a particular input button 22 on panel 20, or the selection of a particular wire 10A. The coding to determine exactly which connection element is lighted can be carried out by the interconnections of the light sources 36 the appropriate connection element by the arrangement of the fibre-optic cables. Thus, the arrangements of the fiber-optic cables can be selected to provide the appropriate coding. Furthermore, in the operation in the mode illustrated and described in FIG. 2, the intermediate cable 42 provides a means for coding the selection of particular connection elements with respect to particular wires 10A to be connected to those elements.

Figure 4:
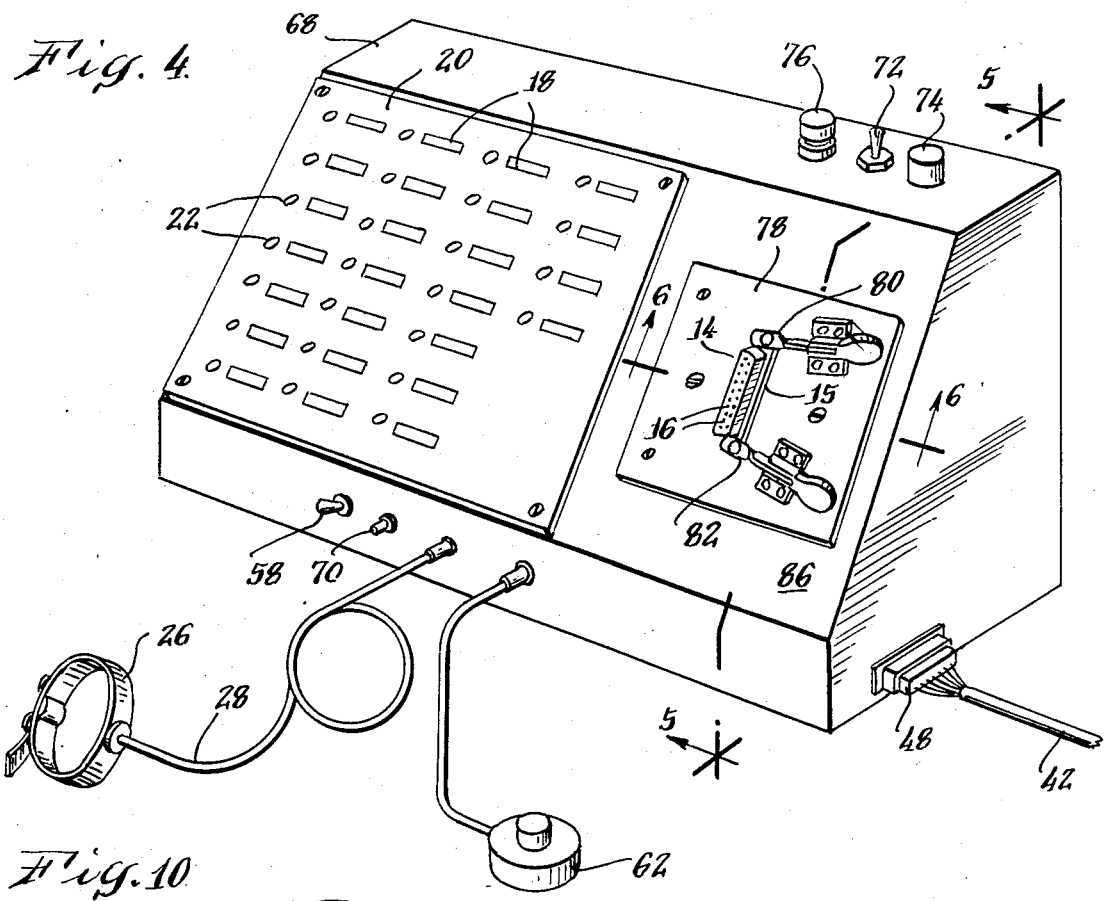
FIG. 4 is a perspective view of a preferred physical structure for the embodiments of the invention.

FIG. 4 is a front perspective view of a cabinet 68 containing the combined apparatus of FIG. 3, and illustrating a preferred physical arrangement of the apparatus. As shown in this drawing, the apparatus is essentially completely enclosed within the cabinet 68, and the panel 20 comprises part of the slanted front of cabinet 68. The selector switch 58 is positioned at the lower front of the cabinet as are jack connections for the foot-switch 62 and for the conductor 28 to the wrist strap 26. A panel push-button reset switch 70 is provided which serves the same function as foot-switch 62 and providing an alternate reset means. An on/off switch is shown at 72 together with a power fuse 76 and an indicator light 74 to indicate when the apparatus is turned on. The fixture for holding the connector mating part 14 to be wired not only includes a mating fixture 15, but also preferably includes a larger organization of parts shown as a supporting panel 78 for fixture 15, and two pivotable clamping devices 80 and 82 mounted on the supporting panel and arranged to hold the mating part 14 to be wired against the fixture part 15. Clamps 80 and 82 are quickly releasable in order to remove the connector part 14 easily after it has been wired and to quickly insert and clamp a new part to be wired.

Figure 5:
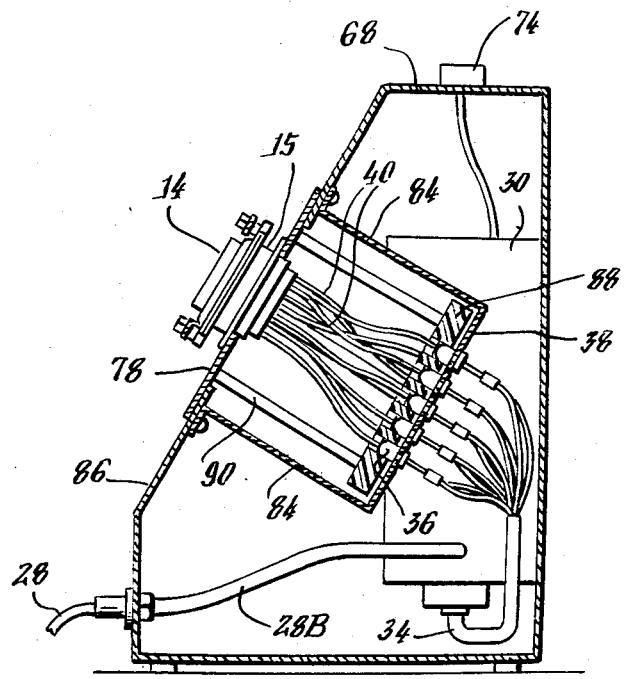
FIG. 5 is a sectional view showing the arrangement of certain parts within the structure of FIG. 4.

FIG. 5 is a sectional side view of the cabinet of FIG. 4 taken at section 5—5. In this view it is seen that the lamp panel 38 carrying the lamps 36 is preferably supported within the cabinet 68 by means of supporting brackets 84 which are attached to the underside of the slanted front panel 86. The brackets 84 may actually constitute the sides of a box and the panel 38 the bottom of the same box. The connector holding fixture not only includes the supporting panel 78, but also a bottom plate 88 attached to the supporting panel 78 by means of interconnecting posts 90. The fiber-optic cables 40 are also preferably considered to be a part of the fixture and extend from the fixture element 15 down to the bottom plate 88. Further details of this structure are illustrated and described in connection with FIG. 6.

FIG. 6 illustrates an enlarged sectional detail view illustrating the full fixture including the fixture element 15, the supporting panel 78, the clamp 82, the interconnection posts 90, the bottom plate 88, and the fiber-optic cables 40.

The bottom plate 48 includes recesses 92 into the bottom surface thereof which form cup means for each of the light sources (lamps 36) to confine the light from each lamp. The recesses 92 may be molded into the bottom plate, or may be counter-bored into the plate. From the inner end of each of the recesses 92, a smaller diameter through-hole is provided into which the individual fiber-optic cables can be inserted. The fiber-optic cables 40 preferably consist of optical glass fibers arranged in a core surrounded by an outer sheath of a resilient material such as vinyl or rubber. The smaller through-holes in the bottom plate connecting with the recesses 92 are preferably sized to provide a snug friction fit with the outside diameter of the fiber-optic cables. Thus, the cables can be connected simply by mechanical insertion. In similar fashion, the other end of each fiber-optic cable is connected into a through-hole within the fixture member 15.

The present invention is especially useful with multiple contact cable end connectors of the type in which both connector parts, the male plug assemblies and the female receptacle assemblies, have a through-hole from the front to the back of each assembly for each wire which is to be connected. The through-holes lend themselves immediately to the preferred arrangement of the present invention wherein the fiber-optic cables individually direct light through the through-holes to indicate where each wire is to be assembled. Useful examples of connectors of this type are produced and sold by AMP Incorporated, of Harrisburg, Pa., U.S.A. in a series of connectors bearing part numbers having seven digits in which the first three digits are 205 and in which the last digit is 1, the last digit being separated from the other six by a hyphen. A typical example includes a plug assembly bearing part number 205208-1, and a mating receptacle assembly bearing part number 205207-1. Connectors of this type are represented in each of the FIGS. 1, 2, 4, 5, and 6.

When a male plug assembly 14 is to be wired, its corresponding blank female receptacle assembly connector part is employed as the fixture part 15, because the two parts are intended to fit together. Use is thus made of this feature in order to provide a fixture 15 for holding the connector 14 which is to be wired in a very simple way. Conversely, when a female receptacle assembly connector part is to be wired, a blank male plug assembly is employed as the fixture part 15. In either case, both parts have through-holes in equal numbers and in perfect alignment so that the light from each fiber-optic cable can shine all the way through. The principles of the invention, as applied to these connectors, are more completely presented in connection with FIGS. 8 and 9 below.

FIG. 7 is a top partial detail view of the fixture of FIG. 6 showing a portion of the supporting panel 78 and the fixture element 15 and illustrating how that fixture element looks when AMP plug assembly part number 205208-1 is employed as the fixture for holding a corresponding receptacle assembly part number 205207-1.

FIG. 8 is an enlarged sectional detail view of the combination of the fixture element 15 of FIG. 7 together with a receptacle mating part 14 which is in position over the fixture element 15 for wiring. Before the wiring is to be carried out, the individual wires 10 are each provided with a crimped-on individual pin receptacle element 94 which fits into the individual connector openings (connection elements) 16, as illustrated at 96. These pin receptacle elements 94 each preferably include a shoulder 98 which serves as a stop to limit the travel into the individual openings 16 at a corresponding shoulder 100 in each opening. Corresponding shoulders 102 are provided in the through-holes (indicating elements) in the plug assembly 15 which serves as the fixture element. The fiber-optic cables 40 are friction fitted into the outer portions of the through-holes in fixture 15 and up against the shoulders 102 within those holes. For clarity, only six of the individual holes 16, and corresponding holes in the fixture element 15, are illustrated in FIG. 8.

FIG. 9 is similar to FIG. 8 except that it illustrates a receptacle connector part 15B employed as the fixture element with a plug connector assembly 14B held in the position to receive individual wires. When the male connector part (plug connector) 14B is to be wired, the individual wires 10 first have individual male pins 104 crimped to each wire end. The wires are then assembled to the connector by inserting each pin into the appropriate opening (connection element) 16B until a shoulder 106 on each pin seats against the shoulder 102 within the corresponding opening, as illustrated at 108. The tip of the pin then extends down into the receptacle assembly 15B as illustrated at 110.

Figure 10:
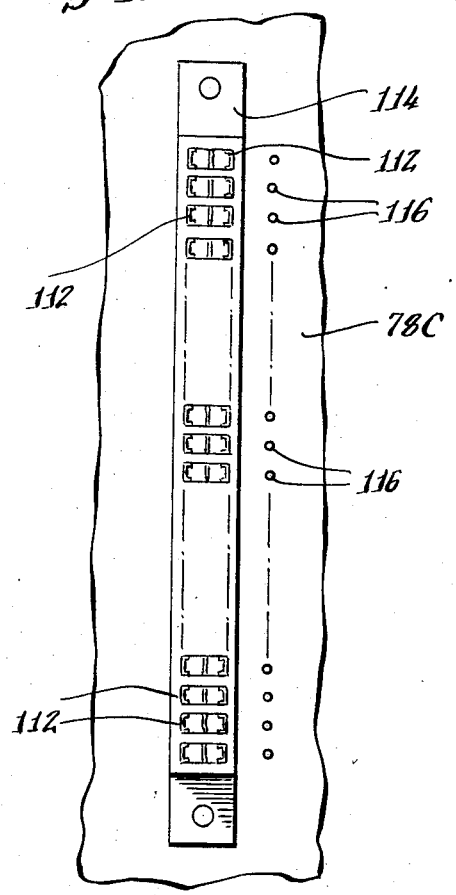
FIG. 10 is a top detail view corresponding to FIG. 7 showing an alternative embodiment of the fixture of FIG. 6 for wiring a different type of connector.

FIG. 10 illustrates that the principles of the invention are readily adapted to the wiring of cable end connectors of types other than the specific connectors described immediately above, and even to connectors which do not have through-holes at the points of connection. More specifically, FIG. 10 illustrates an end view of the end to which wires are to be attached for a cable end connector of the type which is commonly used for making connections to the opposite surfaces at one edge of a printed circuit board supported upon a fixture supporting panel 78C. A typical connector of this type is offered by AMP as part number 582777-1. That is the connector which is pictured in FIG. 10. The connector provides a total of 44 connections, 22 to each side of the circuit board through individual contacts. The individual terminal ends of the contacts are shown at 112. For holding this connector securely upon the corresponding fixture, a fixture element (not shown) is preferably provided which simulates the edge of a printed circuit board to which the connector 114 is intended to be attached.

In the embodiment of FIG. 10, in order to provide the individual optical signals indicating where each wire is to be attached, the fixture supporting panel 78C is provided with a row of openings (windows) indicated at 116, each window 116 being aligned with a corresponding adjacent contact 112. A suitable fixture element is provided beneath the windows 116 to hold a fiber-optic cable beneath each opening. Thus, when a particular contact is to be wired, a corresponding light appears to the operator at the window 116 directly adjacent to that contact.

In FIG. 10, only one set of the windows 116 is illustrated on one side of the connector 114. It is obvious that another set of windows 116 may be provided on the opposite side of the connector to provide distinct signals for each of the 44 contacts 112. However, in an apparatus having the limitations as illustrated wherein only 25 light sources and selection circuits are provided, the 44 element connector 114 can be wired in two stages with a fixture such as illustrated in FIG. 10 having the light indicator windows 116 on only one side by first wiring the contact on one side, and then reversing the connector and wiring the contacts on the other side.

Actually, different coding will generally be required for the two sides so that two different fixtures such as shown in FIG. 10 will typically be employed, differing only in the arrangements of the fiber-optic cables to provide different coding for the two different rows of contacts 112.

While this invention has been shown and described in connection with particular preferred embodiments, various alterations and modifications will occur to those skilled in the art. Accordingly, the following claims are intended to define the valid scope of this invention over the prior art, and to cover all changes and modifications falling within the true spirit and valid scope of this invention.

We claim:

1. A wire position indicator operable in a first mode for correlating the identification of individual color coded wire ends of a cable to be connected to individual connection elements of a mating part of a cable end connector and in a second mode for connecting individual wire ends of a cable to be connected to individual connection elements of a mating part of a cable end connector the other end of which has already been permanently wired to a cable end connector part, said wire position indicator comprising, in combination:

a fixture for holding the one of the mating parts of the cable end connector which is to be wired; said fixture including a number of indicating elements corresponding to the number of connection elements of the connector part to be wired; each of said indicating elements being positioned to identify a particular connection element;

a plurality of light sources corresponding in number to least the number of said indicating elements; said light sources being arranged in a predetermined pattern and substantially in a common plane;

said fixture comprising a supporting panel including said indicating elements and a bottom plate attached to said supporting panel by means of intervening supporting elements; said bottom plate of said fixture including cup means for each of said light sources for confining the light from each of said light sources; said cup means for each of said light sources comprising an opening in the bottom of said bottom plate; said bottom plate including a smaller opening extending through from the upper surface of said bottom plate to each of said cup means openings; said smaller openings comprising the means for inter-connecting said fiber-optic cables to said cup means; said fiber-optic cables being respectively connected from said light source cup means at said bottom plate to said indicating elements at said supporting panel;

a plurality of electrical elements each respectively identifying a particular wire to be assembled into a particular connection element of the connector part; means for making an electrical connection to said electrical elements one element at a time to identify a wire to be assembled, each of said means for making an electrical connection to an electrical element identifying a particular wire to be assembled comprising a switch having a wire identifying indicia associated therewith to identify the particular wire served by each switch;

electrical driving means connected to respond to said electrical connection means for energizing the one of said light sources corresponding to the connection element to which said wire is to be assembled;

a first mating part of a cable end connector which is wired to said electrical driving means and which is operable to receive the wired mating part of a cable end connector to which the cable in process is already wired to thereby establish connections to the individual wires to be assembled; and a probe for making an electrical connection to a selected wire which is to be assembled to thereby complete the circuit to said electrical driving means.

* * * * *